(12) United States Patent
Kulkarni et al.

(10) Patent No.: US 11,211,263 B2
(45) Date of Patent: Dec. 28, 2021

(54) STRUCTURE FOR ARRAYED PARTIAL MOLDING OF PACKAGES

(71) Applicant: QUALCOMM Incorporated, San Diego, CA (US)

(72) Inventors: Srikanth Kulkarni, San Diego, CA (US); Rajneesh Kumar, San Diego, CA (US); Sayok Chattopadhyay, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 157 days.

(21) Appl. No.: 16/687,778

(22) Filed: Nov. 19, 2019

(65) Prior Publication Data

US 2021/0151330 A1    May 20, 2021

(51) Int. Cl.
| | |
|---|---|
| *H01L 21/56* | (2006.01) |
| *H01L 23/31* | (2006.01) |
| *H01L 25/16* | (2006.01) |
| *H01L 21/768* | (2006.01) |
| *H01L 21/66* | (2006.01) |
| *H01L 21/78* | (2006.01) |

(52) U.S. Cl.
CPC ...... *H01L 21/565* (2013.01); *H01L 21/76802* (2013.01); *H01L 21/76877* (2013.01); *H01L 22/14* (2013.01); *H01L 23/3128* (2013.01); *H01L 23/3135* (2013.01); *H01L 25/16* (2013.01); *H01L 21/561* (2013.01); *H01L 21/78* (2013.01)

(58) Field of Classification Search
CPC ..... H01L 21/56; H01L 21/561; H01L 21/563; H01L 21/565; H01L 21/568; H01L 23/31–3192; H01L 2224/26175; H01L 25/0652; H01L 25/0655; H01L 25/0657; H01L 25/071; H01L 25/072; H01L 25/073; H01L 25/105; H01L 25/11; H01L 25/112; H01L 25/115; H01L 25/117; H01L 25/16; H01L 25/18; H01L 25/50
See application file for complete search history.

(56) References Cited

U.S. PATENT DOCUMENTS

| | | | |
|---|---|---|---|
| 2008/0067650 A1* | 3/2008 | Sham | H01L 23/552 257/678 |
| 2008/0081401 A1* | 4/2008 | Shizuno | H01L 21/563 438/123 |
| 2008/0142996 A1* | 6/2008 | Subramanian | H01L 21/563 257/788 |

(Continued)

*Primary Examiner* — Robert G Bachner
*Assistant Examiner* — Molly K Reida
(74) *Attorney, Agent, or Firm* — Patterson & Sheridan, L.L.P.

(57) ABSTRACT

Certain aspects of the present disclosure provide apparatus and techniques for partially molding packages for integrated circuits. A packaged assembly for integrated circuits includes: a substrate having at least one mold barrier between a first region on a first surface of the substrate and a second region on the first surface; a die attached to the substrate; one or more components attached to the substrate in the first region; and a first encapsulant over the one or more components in the first region, wherein the at least one mold barrier is configured to block a portion of the first encapsulant from moving from the first region of the substrate to the second region of the substrate during an application of the first encapsulant.

17 Claims, 7 Drawing Sheets

(56) References Cited

U.S. PATENT DOCUMENTS

| | | | |
|---|---|---|---|
| 2008/0179738 A1* | 7/2008 | Nishimura | H01L 24/29 257/737 |
| 2009/0250810 A1* | 10/2009 | Pendse | H01L 23/49816 257/723 |
| 2010/0078791 A1* | 4/2010 | Yim | H01L 25/0655 257/686 |
| 2021/0057299 A1* | 2/2021 | Hong | H01L 21/56 |

* cited by examiner

STRUCTURE FOR ARRAYED PARTIAL MOLDING OF PACKAGES

BACKGROUND

Field of the Disclosure

Aspects of the present disclosure relate to integrated circuits, and more particularly, to apparatus and techniques for partially molding packages for integrated circuits.

Description of Related Art

Electronic devices, such as computers, wireless communications devices (e.g., cellular phones and Wi-Fi access points), and calculators, have come into widespread use in recent years. The electronic devices typically include one or more integrated circuits (ICs). These ICs are typically included in one or more dies and other electronic components, which may be included in an IC package for assembly on a printed circuit board (PCB) and included in an electronic device.

Packaging integrated circuit dies and other components together in modules (also referred to herein as "packaged assemblies") may enable electronic devices to have a smaller form factor while providing improved electrical performance (e.g., reduced power consumption) and thermal performance (e.g., reduced heat generation), as compared to previously known electronic devices. For example, a cellular phone may have improved battery life due to a reduction in power consumed by a transceiver module in which dies and other components are assembled in a packaged assembly.

SUMMARY

The methods and assemblies of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved yield of electronic modules while enabling subsequent addition of memory and/or other components.

Certain aspects of the present disclosure provide a method for fabricating a packaged assembly for integrated circuits. The method generally includes attaching a die to a substrate, wherein the substrate has at least one mold barrier between a first region on a first surface of the substrate and a second region on the first surface; attaching one or more components to the substrate in the first region; applying a first encapsulant over the one or more components in the first region; and blocking, with the at least one mold barrier, a portion of the first encapsulant from moving from the first region of the substrate to the second region of the substrate during the application of the first encapsulant.

Certain aspects of the present disclosure provide a packaged assembly for integrated circuits. The assembly generally includes a substrate having at least one mold barrier between a first region on a first surface of the substrate and a second region on the first surface; a die attached to the substrate; one or more components attached to the substrate in the first region; and a first encapsulant over the one or more components in the first region, wherein the at least one mold barrier is configured to block a portion of the first encapsulant from moving from the first region of the substrate to the second region of the substrate during an application of the first encapsulant.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1A:
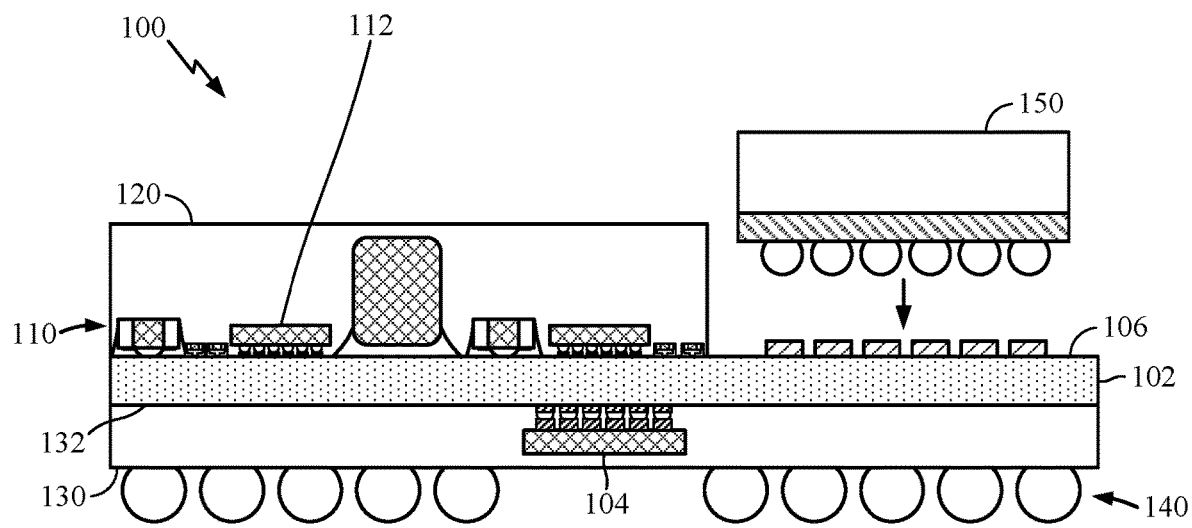
FIGS. 1A and 1B are a cross-sectional view and a top view, respectively, of an exemplary packaged assembly, in accordance with certain aspects of the present disclosure.

Aspects of the present disclosure provide apparatus and methods, for partially molding packages for integration of dies and passives into packaged assemblies (e.g., wireless communication modules). Assembling packages with dies that have not been fully tested typically causes a high yield loss in the packaged assemblies, due to the inclusion of defective dies. However, the dies cannot be fully tested while still attached to the wafers on which the dies are fabricated to screen out all the bad dies. The packaged assemblies are typically more expensive than the dies, and so it is desirable to test each die before all of the components are assembled into a package. However, it is also desirable to fabricate packaged assemblies to which other components (e.g., memory packages) can be added at a later time, such as during assembly of a wireless communication device, like a cellular phone. Partially molding packaged assemblies may enable protection of the assemblies and their components, which may enable shipment of the assemblies to other facilities (e.g., facilities for final assembly of electronic devices) where other components (e.g., memory packages) can be added to the assemblies in the unmolded region of each assembly.

In aspects of the present disclosure, a packaged assembly includes a substrate that has at least one mold barrier between a first region of the substrate and a second region of the substrate. The mold barrier prevents an encapsulant, which is applied over components on the substrate in the first region, from moving from the first region of the substrate to the second region of the substrate. The packaged assembly may be tested to confirm operation of a die or other components mounted to the substrate. One or more other components may be mounted to the second region of the substrate after the packaged assembly has been tested. Preventing the encapsulant from entering the second region may prevent the encapsulant from interfering with the mounting of the other components to the second region of the substrate.

The following description provides examples of partially molded packaged assemblies, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Figure 1B:
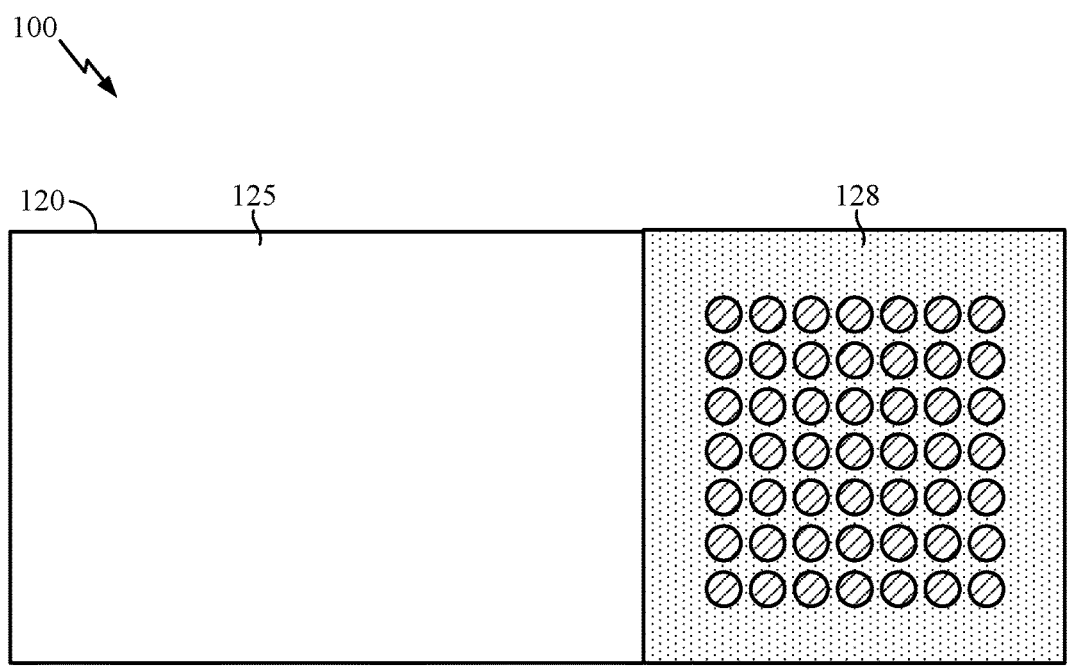

FIG. 1A is a cross-sectional view of an exemplary packaged assembly 100, in accordance with certain aspects of the present disclosure. FIG. 1B is a top view of the exemplary packaged assembly 100. The packaged assembly 100 includes a substrate 102, at least one die 104, one or more components 110 (e.g., other dies and/or passive components), a quantity of encapsulant 120 in a first region 125 on a first (e.g., top) surface 106 of the substrate, and an unmolded second region 128 on the first surface of the substrate. The packaged assembly 100 may optionally include another quantity of encapsulant 130 on a second (e.g., bottom) surface 132 of the substrate, one or more additional dies 112 (e.g., a power management integrated circuit (PMIC)), and pins of the exemplary packaged assembly 100, which may be implemented as a ball grid array (BGA) of solder balls 140. Additionally or alternatively, pins of the exemplary packaged assembly 100 may be a grid of contacts in a land grid array (LGA) or groups of leads along the periphery of the package in a small outline package (SOP) arrangement, instead of the illustrated BGA.

As illustrated in FIG. 1A, an integrated circuit (IC) package 150, such as a memory package, may be surface mounted to the packaged assembly 100 in the second region 128 of the first surface 106 of the substrate 102. The IC package 150 may be mounted to the packaged assembly 100 after testing of the packaged assembly. The testing of the packaged assembly 100 may ensure that the die 104 is functional before the IC package 150 is mounted on the packaged assembly.

Figure 2:
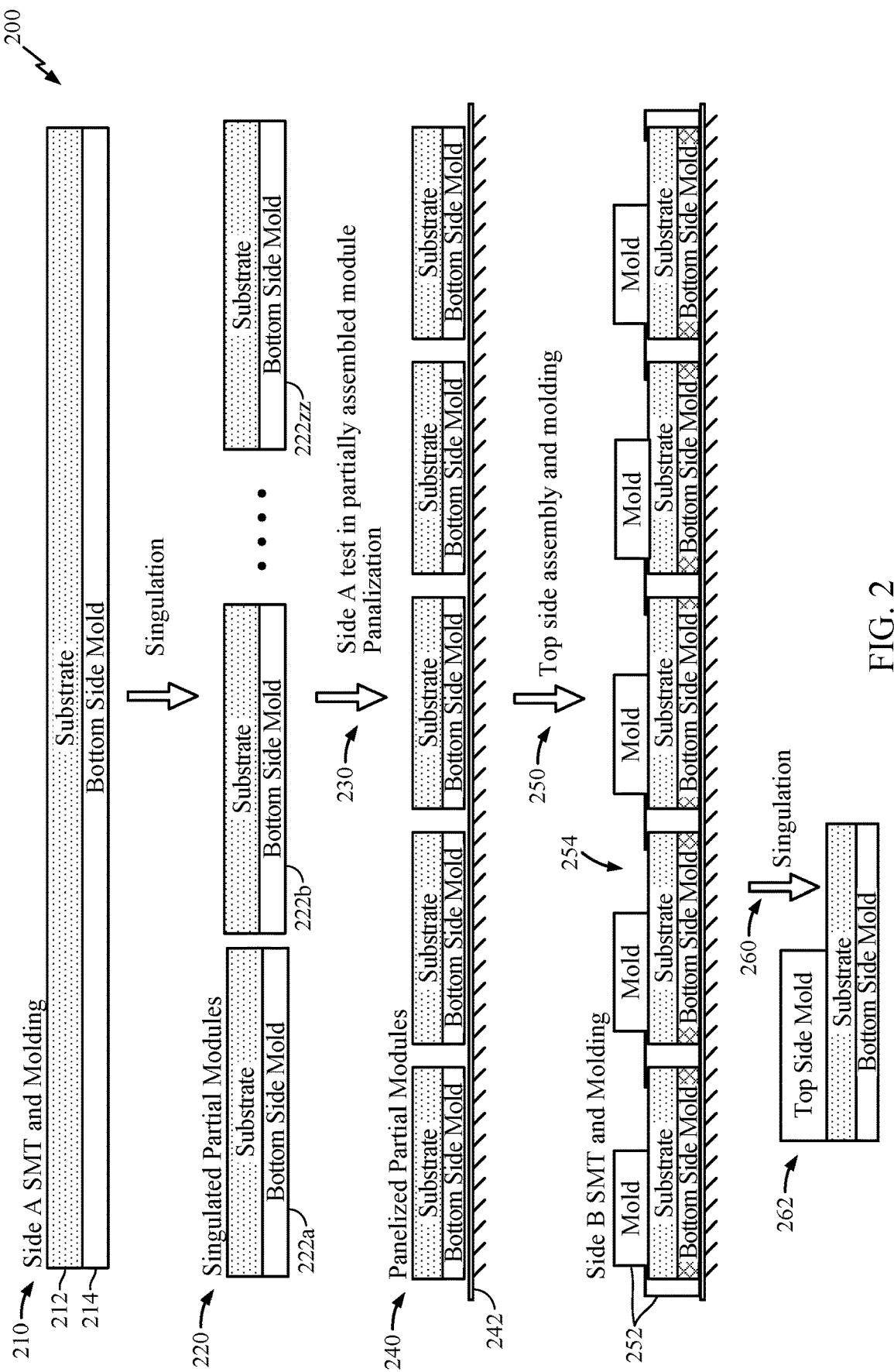
FIG. 2 is an exemplary process flow for manufacturing packaged assemblies, in accordance with certain aspects of the present disclosure.

FIG. 2 is a schematic of an exemplary process flow 200 for manufacturing packaged assemblies with partial molding, in accordance with certain aspects of the present disclosure. The exemplary process flow 200 begins at 210 with mounting (e.g., using a surface mount technology (SMT)) one or more electronic components, such as dies (e.g., die 104, shown in FIG. 1A) and/or passives, to a first surface (e.g., Side A or the bottom surface) of a wafer-level substrate 212 and applying an encapsulant 214 over the components. The encapsulant 214 may include a resin, for example. Next, at 220, the encapsulated wafer is singulated (e.g., by cutting) into individual assemblies 222a, 222b, . . . 222zz (collectively referred to as "individual assemblies 222"). The individual assemblies 222 are tested at 230 to exclude individual assemblies that have a defect (e.g., a malfunctioning die or open circuit). The individual assemblies which pass testing are then panelized, that is, attached to a panel 242 at 240. Additional components, such as dies and passives, are mounted to a second surface (e.g., Side B or the top surface) of each individual assembly, and encapsulant 252 is applied (e.g., molded) over the second surface of the individual assemblies on the panel. The encapsulant 252 may include a resin, for example, and may be the same or different from the material of the encapsulant 214. In aspects of the present disclosure, the encapsulant 252 is allowed to flow over the second surface of the individual assemblies, and a mold barrier may block the encapsulant 252 from entering a region 254 (similar to region 128, shown in FIG. 1B) of each individual assembly. At 260, the individual assemblies on the panel 242 are singulated into partially molded packaged assemblies 262, similar to the partially molded packaged assembly 100 shown in FIG. 1A.

Example Structure for Arrayed Partial Molding of Packaged Assemblies

Aspects of the present disclosure provide techniques for arrayed partial molding of packages for integrated circuits, such as wireless communications modules.

In aspects of the present disclosure, a technique for arrayed partial molding of integrated circuit packages (also referred to herein as "packaged assemblies") includes blocking, with a mold barrier, a portion of an encapsulant from entering a region of a substrate of the package.

According to aspects of the present disclosure, a packaged assembly for integrated circuits includes a substrate having at least one mold barrier between a first region on a surface of the substrate and a second region of the surface.

Figure 3:
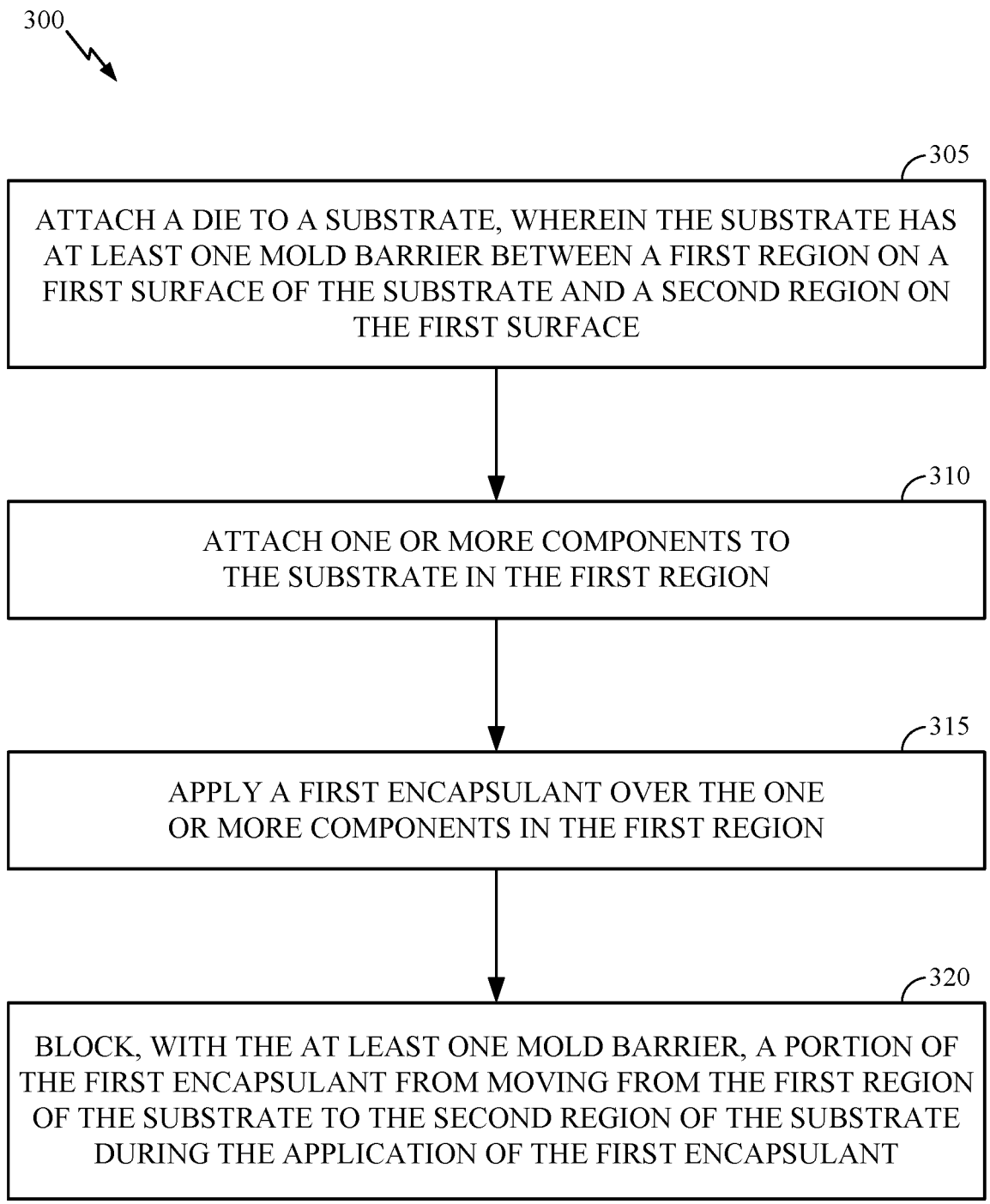
FIG. 3 is a flow diagram illustrating example operations for fabricating a packaged assembly, in accordance with certain aspects of the present disclosure.

FIG. 3 is a flow diagram illustrating example operations 300 for fabricating a packaged assembly for integrated circuits, in accordance with certain aspects of the present disclosure. The operations 300 may be performed, for example, by an integrated circuit packaging facility.

The operations 300 may begin, at block 305, by attaching a die to a substrate (see, e.g., substrate 102 described above with reference to FIG. 1A), wherein the substrate has at least one mold barrier (see, e.g., mold barrier 405 described below with reference to FIGS. 4A and 4B) between a first region (see, e.g., first region 425 described below with reference to FIG. 4B) on a first surface of the substrate and a second region (see, e.g., second region 428 described below with reference to FIG. 4B) on the first surface.

Operations 300 continue, at block 310, by attaching one or more components (see, e.g., components 110 described above with reference to FIG. 1A) to the substrate in the first region.

Operations 300 continue, at block 315, by applying a first encapsulant (see, e.g., encapsulant 120 described above with reference to FIG. 1A) over the one or more components in the first region.

Operations 300 continue, at block 320, with the at least one mold barrier blocking a portion of the first encapsulant from moving from the first region of the substrate to the second region of the substrate during the application of the first encapsulant at block 315.

According to aspects of the present disclosure, attaching the die to the substrate in block 305 as described above may include attaching the die to the first surface in the first region of the substrate (see, e.g., components 110 described above with reference to FIG. 1A, which may include a die).

In aspects of the present disclosure, attaching the die to the substrate in block 305 as described above may include attaching the die to a second surface (see, e.g., die 104 described with reference to FIG. 1A, above) of the substrate, the second surface being different from the first surface. According to certain aspects of the present disclosure, the operations 300 may include applying a second encapsulant (see, e.g., encapsulant 130 described with reference to FIG. 1A, above) over the die and the second surface of the substrate.

According to aspects of the present disclosure, the operations 300 may include applying solder resist to the first surface of the substrate to form the at least one mold barrier (see, e.g., mold barrier 405 described below with reference to FIG. 4A).

In aspects of the present disclosure, the operations 300 may include forming at least one trench (see, e.g., mold barrier trenches 505a-d described below with reference to FIG. 5A) in the first surface of the substrate to form the at least one mold barrier. According to certain aspects of the present disclosure, the operations 300 may include disposing a metal trace (see, e.g., metal traces 560 described below with reference to FIG. 5A) in the at least one trench.

According to aspects of the present disclosure, the operations 300 may include testing the packaged assembly comprising the die, the substrate, and the components.

Figure 4A:
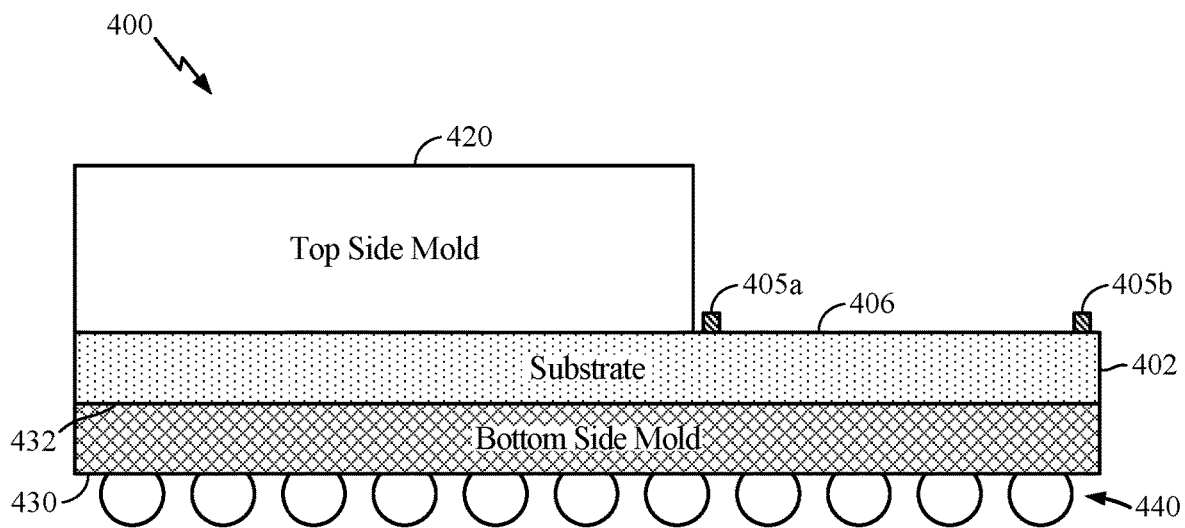
FIGS. 4A and 4B are a cross-sectional view and a top view, respectively, of an exemplary packaged assembly having a mold barrier, in accordance with certain aspects of the present disclosure.
Figure 4B:
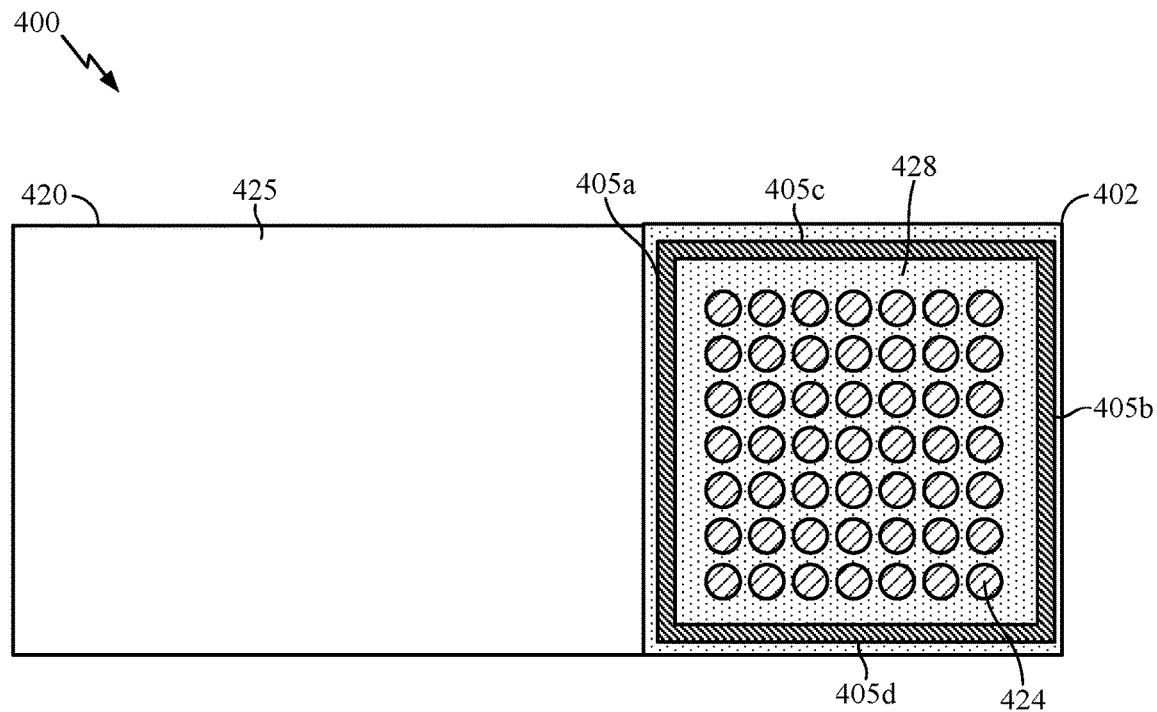

FIGS. 4A and 4B are a cross-sectional view and a top view, respectively, of an exemplary packaged assembly 400 having a mold barrier 405 with four mold barrier segments, which are implemented here as mold barrier walls 405a-d, in accordance with certain aspects of the present disclosure. As illustrated in FIGS. 4A and 4B, the mold barrier walls 405a-d are connected, thereby forming a continuous mold barrier. For other aspects, at least two adjacent mold barrier walls may be disconnected, thereby forming a disjointed mold barrier. While the packaged assembly 400 is illustrated with a four-sided mold barrier, the present disclosure is not so limited, and other mold barriers in accordance with aspects of the present disclosure may have more or fewer mold barrier walls (see, e.g., FIGS. 6A-D and 7A). As with the exemplary packaged assembly 100 (shown in FIGS. 1A and 1B), the packaged assembly 400 includes a substrate 402, a quantity of encapsulant 420 (e.g., a top side mold) in a first region 425 on a first (e.g., top) surface 406 of the substrate, and an unmolded second region 428 on the first surface of the substrate. A border between the first region 425 and the second region 428 corresponds to the mold barrier wall 405a. Thus, the first surface 406 (and the packaged assembly 400) may be considered as partially molded. The unmolded second region 428 may include contact pads 424 for subsequently connecting with one or more electronic components (e.g., a memory package) after fabrication of the partially molded packaged assembly. Also as with the packaged assembly 100, the packaged assembly 400 may optionally include another quantity of encapsulant 430 (e.g., a bottom side mold) on a second (e.g., bottom) surface 432 of the substrate, and pins of the packaged assembly may be implemented as a ball grid array (BGA) of solder balls 440. Additionally or alternatively, pins of the packaged assembly 400 may be implemented as a grid of contacts in a land grid array (LGA) or groups of leads along the periphery of the packaged assembly in a small outline package (SOP) arrangement, instead of the illustrated BGA. The mold barrier 405 may be made from solder resist or other materials suitable for blocking encapsulant from moving from the first region 425 into the second region 428 and suitable for inclusion in a package for an integrated circuit. For example, the substrate 402 may be exposed to a light source shone through a photomask such that solder resist can be deposited on the substrate via photolithography to form the mold barrier.

In aspects of the present disclosure, the mold barrier 405 illustrated in FIGS. 4A and 4B may prevent the encapsulant 420 from flowing from the first region 425 to the second region 428 of the first surface 406 of the substrate 402 during application of the encapsulant 420 while fabricating the packaged assembly 400.

According to aspects of the present disclosure, the mold barrier 405 illustrated in FIGS. 4A and 4B may prevent encapsulant flowing over an array of individual assemblies on a panel (see FIG. 2) from flowing onto the second region 428 of the first surface 406 of the substrate 402.

Figure 5A:
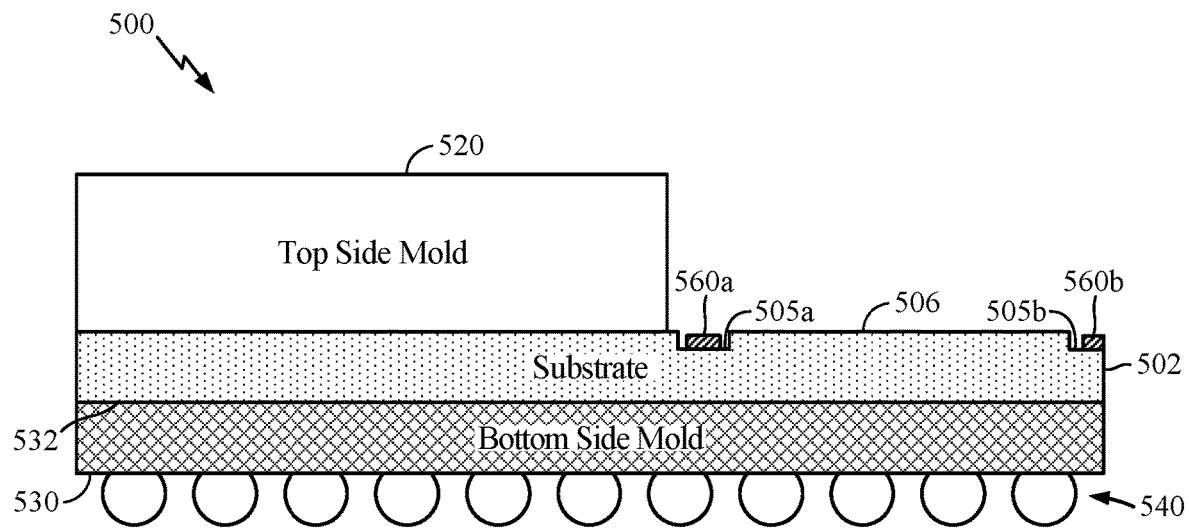
FIGS. 5A and 5B are a cross-sectional view and a top view, respectively, of an exemplary packaged assembly having a mold barrier trench, in accordance with certain aspects of the present disclosure.
Figure 5B:
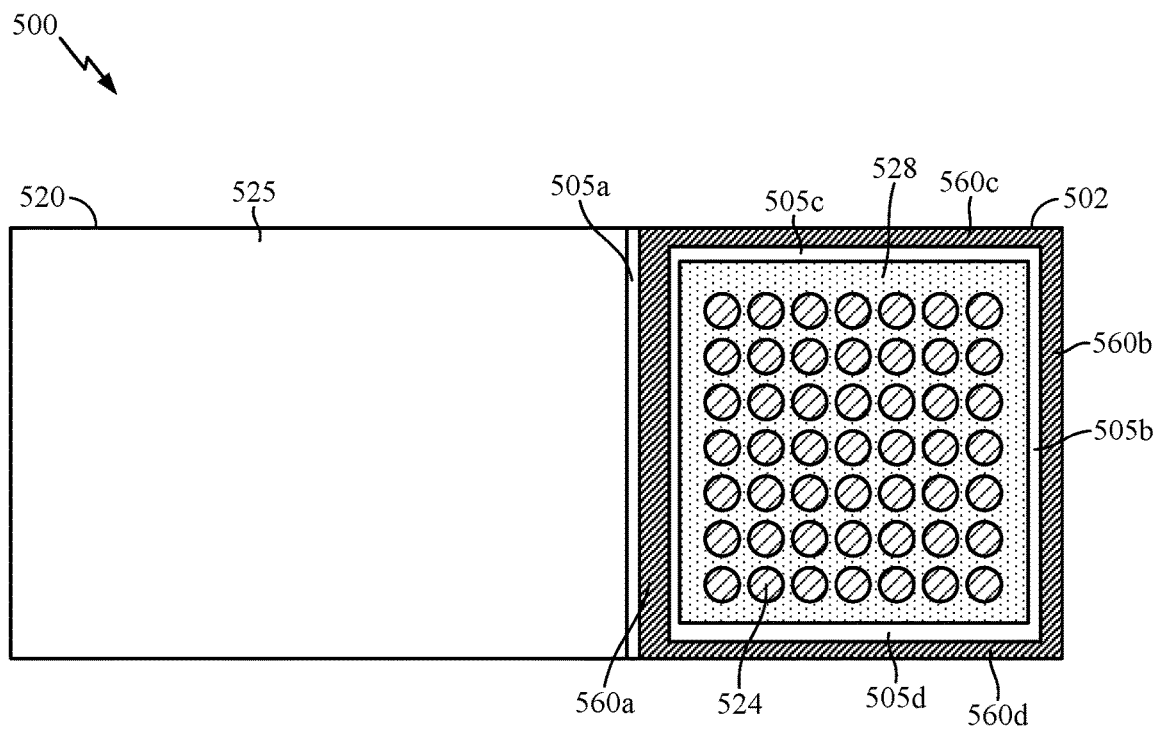

FIGS. 5A and 5B are a cross-sectional view and a top view, respectively, of an exemplary packaged assembly 500 having a mold barrier 505 formed by four mold barrier segments, which are implemented here as four mold barrier trenches 505a-d, in accordance with certain aspects of the present disclosure. As illustrated in FIGS. 5A and 5B, the mold barrier trenches 505a-d are connected, thereby forming a continuous mold barrier. For other aspects, at least two adjacent mold barrier trenches may be disconnected, thereby forming a disconnected mold barrier. While the packaged assembly 500 is illustrated with a four-sided mold barrier, the present disclosure is not so limited, and other mold barriers in accordance with aspects of the present disclosure may have more or fewer mold barrier trenches (see, e.g., FIGS. 6A-D and 7A). As with the exemplary packaged assembly 100 (shown in FIGS. 1A and 1B), the packaged assembly 500 includes a substrate 502, a quantity of encapsulant 520 (e.g., a top side mold) in a first region 525 on a first (e.g., top) surface 506 of the substrate, and an unmolded second region 528 on the first surface of the substrate. A border between the first region 525 and the second region 528 corresponds to the mold barrier trench 505a. Thus, the first surface 506 (and the packaged assembly 500) may be considered as partially molded. The unmolded second region 528 may include contact pads 524 for subsequently connecting with one or more electronic components (e.g., a memory package) after fabrication of the partially molded packaged assembly. Also as with the packaged assembly 100, the packaged assembly 500 may optionally include another quantity of encapsulant 530 (e.g., a bottom side mold) on a second (e.g., bottom) surface 532 of the substrate, and pins of the packaged assembly 500 may be implemented as a BGA of solder balls 540. Additionally or alternatively, pins of the packaged assembly 500 may be implemented as a grid of contacts in a land grid array (LGA) or as groups of leads along the periphery of the assembly in a small outline package (SOP) arrangement, instead of the illustrated BGA.

In the packaged assembly 500, the mold barrier trenches 505a-d on the first surface 506 may be formed by removing (e.g., etching) material from the first surface of the substrate 502. For example, a photomask may be applied via photolithography to the first surface 506 of the substrate 502, and exposed portions of the first surface may be etched away to form the mold barrier trenches 505a-d. Optionally, one or more metal traces 560 may be disposed in one or more of the mold barrier trenches. In FIGS. 5A and 5B, four metal traces 560a-d are illustrated, one in each of the mold barrier trenches 505a-d. The metal traces 560 may act to prevent the flow of the encapsulant 520 from the first region 525 to the second region 528 during application of the encapsulant. The metal traces 560 may partially or completely fill the trenches 505a-d.

In aspects of the present disclosure, the mold barrier trenches 505a-d illustrated in FIGS. 5A and 5B may prevent the encapsulant 520 from flowing from the first region 525 to the second region 528 of the first surface 506 of the substrate 502 during application of the encapsulant 520 while fabricating the packaged assembly 500.

According to aspects of the present disclosure, the mold barrier trenches 505a-d illustrated in FIGS. 5A and 5B may prevent encapsulant flowing over an array of individual assemblies on a panel (see FIG. 2) from flowing onto the second region 528 of the first surface 506 of the substrate 502.

In aspects of the present disclosure, the one or more metal traces 560 illustrated in FIGS. 5A and 5B may prevent the encapsulant 520 from flowing from the first region 525 to the second region 528 of the first surface 506 of the substrate 502 during application of the encapsulant 520 while fabricating the packaged assembly 500.

According to aspects of the present disclosure, the one or more metal traces 560 illustrated in FIGS. 5A and 5B may prevent encapsulant flowing over an array of individual assemblies on a panel (see FIG. 2) from flowing onto the second region 528 of the first surface 506 of the substrate 502.

Although not shown explicitly in FIGS. 4A and 4B or in FIGS. 5A and 5B, the packaged assembly may include more than one mold barrier. For example, the packaged assembly may include a first mold barrier at least partially surrounding a second mold barrier (e.g., two concentric mold barriers). In this case, as an example, the first mold barrier may be implemented with mold barrier trenches (with or without metal traces disposed therein), and the second mold barrier may be implemented with mold barrier walls. For certain aspects, the multiple mold barriers may protect different regions on the first surface of the substrate (e.g., for two sets of contact pads for two different IC dies to be subsequently added to the packaged assembly).

Figure 6B:
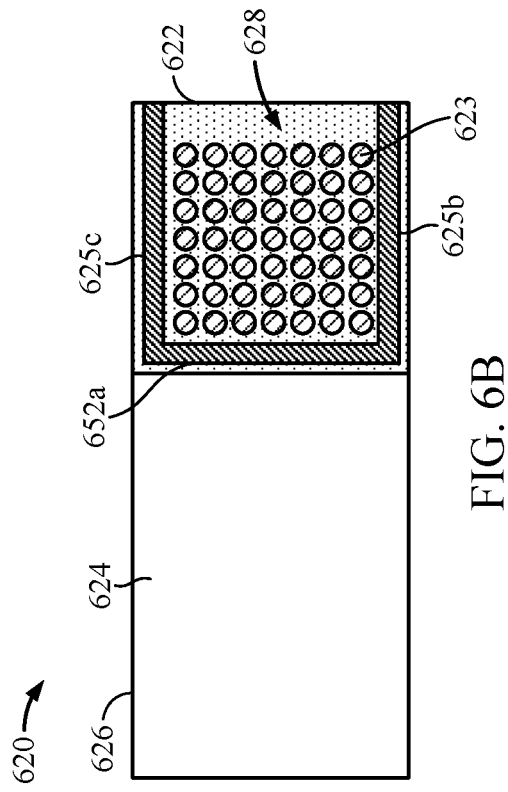
FIGS. 6A-6D are top views of exemplary packaged assemblies having different mold barriers, in accordance with aspects of the present disclosure.
Figure 6D:
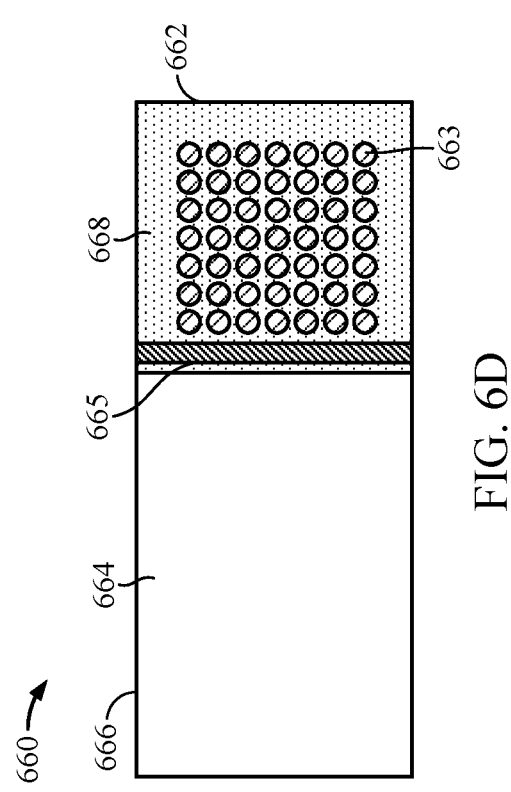
Figure 6A:
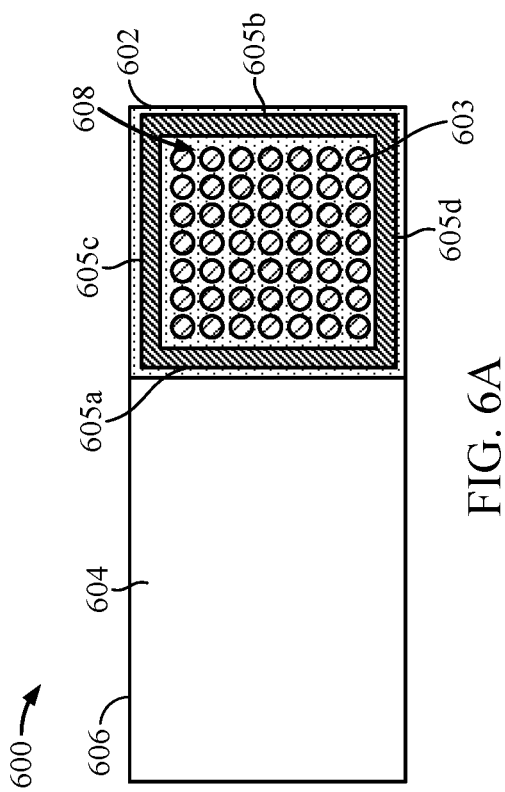

FIG. 6A is a top view of an exemplary packaged assembly 600 having a mold barrier 605 with four mold barrier segments 605a-d, in accordance with certain aspects of the present disclosure. The four-sided mold barrier 605 may consist of material deposited on a substrate 602 (see, e.g., mold barrier walls 405a-d in FIGS. 4A and 4B), trenches formed by removing material from the substrate (see, e.g., mold barrier trenches 505a-d in FIGS. 5A and 5B), or trenches with metal traces deposited in the trenches (see, e.g., metal traces 560a-d in FIGS. 5A and 5B), according to aspects of the present disclosure. For certain aspects, the mold barrier segments may be implemented with a combination of different structures (e.g., one mold barrier segment implemented as a wall, while another segment is implemented as a trench, with or without a metal trace). As illustrated in FIG. 6A, the mold barrier segments 605a-d are connected, thereby forming a continuous mold barrier. For other aspects, at least two adjacent mold barrier segments may be disconnected, thereby forming a disjointed mold barrier. As with the exemplary packaged assembly 100 (shown in FIGS. 1A and 1B), the packaged assembly 600 includes the substrate 602, a quantity of encapsulant 606 in a first region 604 on a first (e.g., top) surface of the substrate, and an unmolded second region 608 on the first surface of the substrate. A border between the first region 604 and the second region 608 corresponds to the mold barrier segment 605a. Thus, the first surface (and the packaged assembly 600) may be considered as partially molded. The unmolded second region 608 may include contact pads 603 for subsequently connecting with one or more electronic components (e.g., a memory package) after fabrication of the partially molded packaged assembly. Also as with the exemplary packaged assembly 100, the packaged assembly 600 may optionally include another quantity of encapsulant (not shown in FIG. 6A) on a second (e.g., bottom) surface (not shown in FIG. 6A) of the substrate, and pins of the packaged assembly 600 may be implemented as a ball grid array (not shown in FIG. 6A) of solder balls. Additionally or alternatively, pins of the packaged assembly 600 may be implemented as a grid of contacts in a land grid array (LGA) or groups of leads along the periphery of the packaged assembly in a small outline package (SOP) arrangement. The mold barrier 605 may be made from solder resist or other materials suitable for blocking encapsulant from moving from the first region 604 into the second region 608 and suitable for inclusion in a package for an integrated circuit. For example, the substrate 602 may be exposed to a light source shone through a photomask such that solder resist can be deposited on the substrate via photolithography to form the mold barrier.

In aspects of the present disclosure, the four mold barrier segments 605a-d illustrated in FIG. 6A may prevent the encapsulant 606 from flowing from the first region 604 to the second region 608 of the first surface of the substrate 602 during application of the encapsulant while fabricating the packaged assembly 600.

According to aspects of the present disclosure, the four mold barrier segments 605a-d illustrated in FIG. 6A may prevent encapsulant flowing over an array of individual assemblies on a panel (see FIG. 2) from flowing onto the second region 608 of the first surface of the substrate 602.

FIG. 6B is a top view of an exemplary packaged assembly 620 having a mold barrier 625 with three mold barrier segments 625a-c, in accordance with certain aspects of the present disclosure. As illustrated in FIG. 6B, the mold barrier segments 625a-c are connected, thereby forming a continuous mold barrier. For other aspects, at least two adjacent mold barrier segments may be disconnected, thereby forming a disjointed mold barrier. The three mold barrier segments may consist of material deposited on the substrate 622 (see, e.g., FIGS. 4A and 4B), trenches formed by removing material from the substrate (see, e.g., FIGS. 5A and 5B), or trenches with metal traces deposited in the trenches (see, e.g., FIGS. 5A and 5B), according to aspects of the present disclosure. As with the exemplary packaged assembly 100 (shown in FIGS. 1A and 1B), the packaged assembly 620 includes a substrate 622, a quantity of encapsulant 626 in a first region 624 on a first (e.g., top) surface of the substrate, and an unmolded second region 628 on the first surface of the substrate. A border between the first region 624 and the second region 628 corresponds to the mold barrier segment 625a. Thus, the first surface (and the packaged assembly 620) may be considered as partially molded. The unmolded second region 628 may include contact pads 623 for subsequently connecting with one or more electronic components (e.g., a memory package) after fabrication of the partially molded packaged assembly. Also as with the exemplary packaged assembly 100, the packaged assembly 620 may optionally include another quantity of encapsulant (not shown in FIG. 6B) on a second (e.g., bottom) surface (not shown in FIG. 6B) of the substrate, and pins of the packaged assembly 620 may be implemented as a ball grid array (not shown in FIG. 6B) of solder balls. Additionally or alternatively, pins of the packaged assembly 620 may be implemented as a grid of contacts in a land grid array (LGA) or groups of leads along the periphery of the packaged assembly in a small outline package (SOP) arrangement. The mold barrier 625 may be made from solder resist or other materials suitable for blocking encapsulant from moving from the first region 624 into the second region 628 and suitable for inclusion in a package for an integrated circuit. For example, the substrate 622 may be exposed to a light source shone through a photomask such that solder resist can be deposited on the substrate via photolithography to form the mold barrier.

In aspects of the present disclosure, the three mold barrier segments 625a-c illustrated in FIG. 6B may prevent the encapsulant 626 from flowing from the first region 624 to the second region 628 of the first surface of the substrate 622 during application of the encapsulant 626 while fabricating the packaged assembly 620.

According to aspects of the present disclosure, the three mold barrier segments 625a-c illustrated in FIG. 6B may prevent encapsulant flowing over an array of individual assemblies on a panel (see FIG. 2) from flowing onto the second region 628 of the first surface of the substrate 622.

Figure 6C:
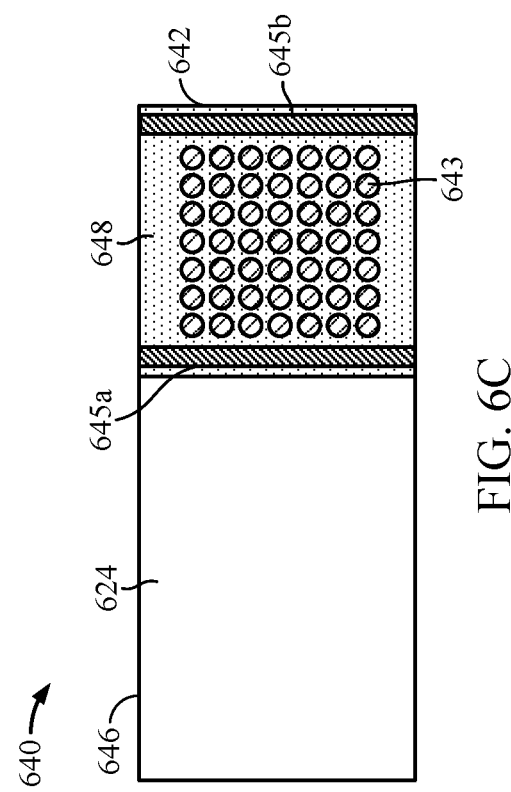

FIG. 6C is a top view of an exemplary packaged assembly 640 having a mold barrier 645 with two mold barrier segments 645a-b, in accordance with certain aspects of the present disclosure. As illustrated in FIG. 6B, the mold barrier segments 625a-b are not connected, thereby forming a disjointed mold barrier. For other aspects, at least two adjacent mold barrier segments may be connected, thereby forming a continuous mold barrier. The two mold barrier segments may consist of material deposited on the substrate 642 (see, e.g., FIGS. 4A and 4B), trenches formed by removing material from the substrate (see, e.g., FIGS. 5A and 5B), or trenches with metal traces deposited in the trenches (see, e.g., FIGS. 5A and 5B), according to aspects of the present disclosure. As with the exemplary packaged assembly 100 (shown in FIGS. 1A and 1B), the packaged assembly 640 includes a substrate 642, a quantity of encapsulant 646 in a first region 644 on a first (e.g., top) surface of the substrate, and an unmolded second region 648 on the first surface of the substrate. A border between the first region 645 and the second region 648 corresponds to the mold barrier segment 645a. Thus, the first surface (and the packaged assembly 640) may be considered as partially molded. The unmolded second region 648 may include contact pads 643 for subsequently connecting with one or more electronic components (e.g., a memory package) after fabrication of the partially molded packaged assembly. Also as with the exemplary packaged assembly 100, the packaged assembly 640 may optionally include another quantity of encapsulant (not shown in FIG. 6C) on a second (e.g., bottom) surface (not shown in FIG. 6C) of the substrate, and pins of the packaged assembly 640 may be implemented as a ball grid array (not shown in FIG. 6C) of solder balls. Additionally or alternatively, pins of the packaged assembly 640 may be implemented as a grid of contacts in a land grid array (LGA) or groups of leads along the periphery of the packaged assembly in a small outline package (SOP) arrangement. The mold barrier 645 may be made from solder resist or other materials suitable for blocking encapsulant from moving from the first region 644 into the second region 648 and suitable for inclusion in a package for an integrated circuit. For example, the substrate 642 may be exposed to a light source shone through a photomask such that solder resist can be deposited on the substrate via photolithography to form the mold barrier.

In aspects of the present disclosure, the two mold barrier segments 645a-b illustrated in FIG. 6C may prevent the encapsulant 646 from flowing from the first region 644 to the second region 648 of the first surface of the substrate 642 during application of the encapsulant 646 while fabricating the packaged assembly 640.

According to aspects of the present disclosure, the two mold barrier segments 645a-b illustrated in FIG. 6C may prevent encapsulant flowing over an array of individual assemblies on a panel (see FIG. 2) from flowing onto the second region 648 of the first surface of the substrate 642.

FIG. 6D is a top view of an exemplary packaged assembly 660 having a mold barrier implemented by a single mold barrier segment 665, in accordance with certain aspects of the present disclosure. The mold barrier segment 665 may consist of material deposited on the substrate 662 (see, e.g., FIGS. 4A and 4B), a trench formed by removing material from the substrate (see, e.g., FIGS. 5A-B), or a trench with a metal trace deposited in the trench (see, e.g., FIGS. 5A and 5B), according to aspects of the present disclosure. As with the exemplary packaged assembly 100 (shown in FIGS. 1A and 1B), the packaged assembly 660 includes a substrate 662, a quantity of encapsulant 666 in a first region 664 on a first (e.g., top) surface of the substrate, and an unmolded second region 668 on the first surface of the substrate. A border between the first region 664 and the second region 668 corresponds to the mold barrier segment 665. Thus, the first surface (and the packaged assembly 660) may be considered as partially molded. The unmolded second region 668 may include contact pads 663 for subsequently connecting with one or more electronic components (e.g., a memory package) after fabrication of the partially molded packaged assembly. Also as with the exemplary packaged assembly 100, the packaged assembly 660 may optionally include another quantity of encapsulant (not shown in FIG. 6D) on a second (e.g., bottom) surface (not shown in FIG. 6D) of the substrate, and pins of the packaged assembly 660 may be implemented as a ball grid array (not shown in FIG. 6D) of solder balls. Additionally or alternatively, pins of the packaged assembly 660 may be implemented as a grid of contacts in a land grid array (LGA) or groups of leads along the periphery of the packaged assembly in a small outline package (SOP) arrangement. The mold barrier segment 665 may be made from solder resist or other materials suitable for blocking encapsulant from moving from the first region 664 into the second region 668 and suitable for inclusion in a package for an integrated circuit. For example, the substrate 662 may be exposed to a light source shone through a photomask such that solder resist can be deposited on the substrate via photolithography to form the mold barrier.

In aspects of the present disclosure, the mold barrier segment 665 illustrated in FIG. 6D may prevent the encapsulant 666 from flowing from the first region 664 to the second region 668 of the first surface of the substrate 662 during application of the encapsulant 666 while fabricating the packaged assembly 660.

Figure 7A:
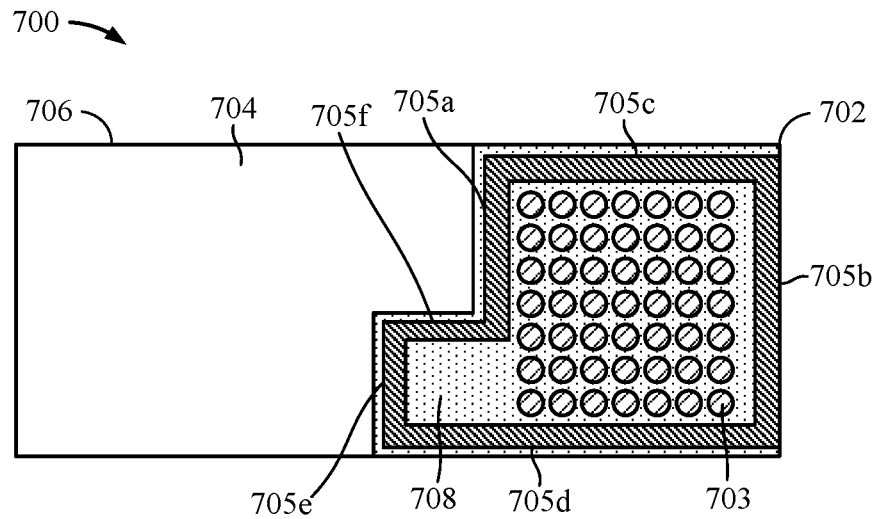
FIGS. 7A-B are top views of exemplary packaged assemblies having different mold barriers of different outline shapes, in accordance with aspects of the present disclosure.

FIG. 7A is a top view of an exemplary packaged assembly 700 having a mold barrier 705 with six mold barrier segments 705a-f that correspond to (e.g., are parallel to) line segments connecting at least three points that are nonlinear on a first surface of a substrate 702 of the packaged assembly, in accordance with certain aspects of the present disclosure. That is, the mold barrier 705 is an example of a mold barrier including a plurality of mold barrier segments 705a-f that connect at least three nonlinear points on the first surface of the substrate of the packaged assembly. While the packaged assembly 700 is illustrated with six mold barrier segments (which may be implemented by mold barrier walls or trenches), the present disclosure is not so limited, and a packaged assembly that is an aspect of the present disclosure may have more or fewer mold barrier segments (see, e.g., FIGS. 6A-D). The mold barrier segments may consist of material deposited on the substrate 702 (see, e.g., FIGS. 4A and 4B), trenches formed by removing material from the substrate (see, e.g., FIGS. 5A and 5B), or trenches with metal traces deposited in the trenches (see, e.g., FIGS. 5A and 5B), according to aspects of the present disclosure. As with the exemplary packaged assembly 100 (shown in FIGS. 1A and 1B), the packaged assembly 700 includes the substrate 702, a quantity of encapsulant 706 in a first region 704 on a first (e.g., top) surface of the substrate, and an unmolded second region 708 on the first surface of the substrate. A border between the first region 704 and the second region 708 corresponds to the mold barrier segments 705a, 705e, and 705f. Thus, the first surface (and the packaged assembly 700) may be considered as partially molded. The unmolded second region 708 may include contact pads 703 for subsequently connecting with one or more electronic components (e.g., a memory package) after fabrication of the partially molded packaged assembly. Also as with the exemplary packaged assembly 100, the packaged assembly 700 may optionally include another quantity of encapsulant (not shown in FIG. 7A) on a second (e.g., bottom) surface (not shown in FIG. 7A) of the substrate, and pins of the packaged assembly 700 may be implemented as a ball grid array (not shown in FIG. 7A) of solder balls. Additionally or alternatively, pins of the packaged assembly 700 may be implemented as a grid of contacts in a land grid array (LGA) or as groups of leads along the periphery of the packaged assembly in a small outline package (SOP) arrangement. The mold barrier 705 may be made from solder resist or other materials suitable for blocking encapsulant from moving from the first region 704 into the second region 708 and suitable for inclusion in a package for an integrated circuit. For example, the substrate 702 may be exposed to a light source shone through a photomask such that solder resist can be deposited on the substrate via photolithography to form the mold barrier.

In aspects of the present disclosure, the six mold barrier segments 705a-f illustrated in FIG. 7A may prevent the encapsulant 706 from flowing from the first region 704 to the second region 708 of the first surface of the substrate 702 during application of the encapsulant while fabricating the packaged assembly 700.

According to aspects of the present disclosure, the six mold barrier segments 705a-f illustrated in FIG. 7A may prevent encapsulant flowing over an array of individual assemblies on a panel (see FIG. 2) from flowing onto the second region 708 of the first surface of the substrate 702.

Figure 7B:
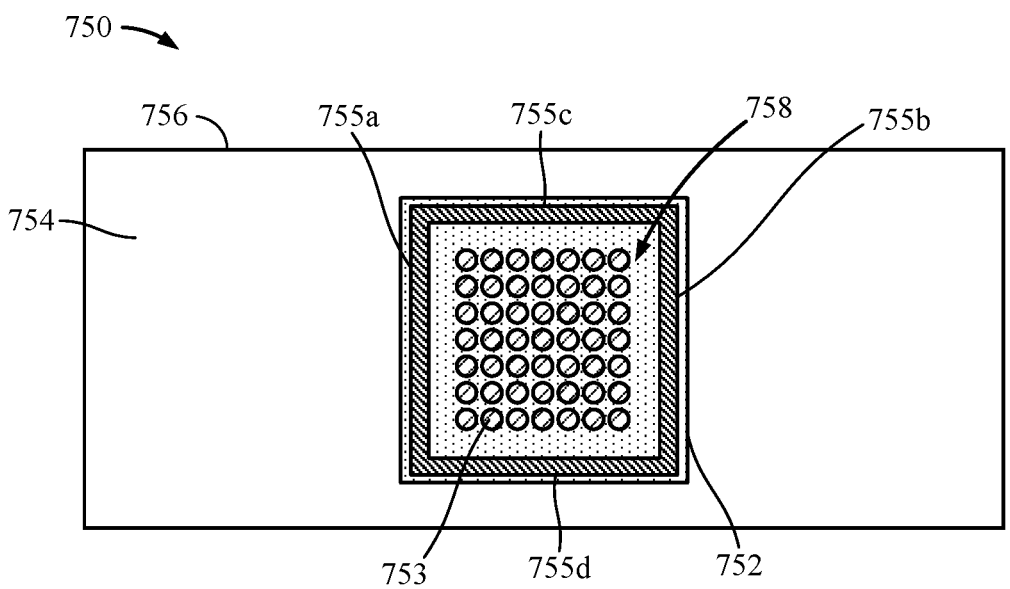

FIG. 7B is a top view of an exemplary packaged assembly 750 having a mold barrier 755 with four mold barrier segments 755a-d that surround a second region 758 of a first (e.g., top) surface of a substrate 752 and are surrounded by a first region 754 of the first surface, in accordance with certain aspects of the present disclosure. In other words, the mold barrier is not restricted to having a mold barrier segment on an edge of the substrate. While the packaged assembly 750 is illustrated with four mold barrier segments 755a-d, the present disclosure is not so limited, and a packaged assembly that is an aspect of the present disclosure may have more or fewer mold barrier segments (see, e.g., FIG. 7A). The mold barrier segments may consist of material deposited on the substrate 702 (see, e.g., FIGS. 4A and 4B), trenches formed by removing material from the substrate (see, e.g., FIGS. 5A and 5B), or trenches with metal traces deposited in the trenches (see, e.g., FIGS. 5A and 5B), according to aspects of the present disclosure. As with the exemplary packaged assembly 100 (shown in FIGS. 1A and 1B), the packaged assembly 750 includes a substrate 752, a quantity of encapsulant 756 in the first region on the first surface of the substrate, and an unmolded second region 758 on the first surface. A border between the first region 754 and the second region 758 corresponds to the mold barrier segments 755a-d. Thus, the first surface (and the packaged assembly 750) may be considered as partially molded. The unmolded second region 758 may include contact pads 753 for subsequently connecting with one or more electronic components (e.g., a memory package) after fabrication of the partially molded packaged assembly. Also as with the exemplary packaged assembly 100, the packaged assembly 750 may optionally include another quantity of encapsulant (not shown in FIG. 7B) on a second (e.g., bottom) surface (not shown in FIG. 7B) of the substrate, and pins of the packaged assembly 750 may be implemented as a ball grid array (not shown in FIG. 7B) of solder balls. Additionally or alternatively, pins of the packaged assembly 750 may be implemented as a grid of contacts in a land grid array (LGA) or as groups of leads along the periphery of the packaged assembly in a small outline package (SOP) arrangement. The mold barrier 755 may be made from solder resist or other materials suitable for blocking encapsulant from moving from the first region 754 into the second region 758 and suitable for inclusion in a package for an integrated circuit. For example, the substrate 752 may be exposed to a light source shone through a photomask such that solder resist can be deposited on the substrate via photolithography to form the mold barrier.

In aspects of the present disclosure, the four mold barrier segments 755a-d illustrated in FIG. 7B may prevent the encapsulant 756 from flowing from the first region 754 to the second region 758 of the first surface of the substrate 752 during application of the encapsulant while fabricating the packaged assembly 750.

According to aspects of the present disclosure, the four mold barrier segments 705a-d illustrated in FIG. 7B may prevent encapsulant flowing over an array of individual assemblies on a panel (see FIG. 2) from flowing onto the second region 758 of the first surface of the substrate 752.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. Generally, where there are operations illustrated in figures, those operations may have corresponding counterpart means-plus-function components with similar numbering.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A method for fabricating a packaged assembly for integrated circuits, comprising:
   attaching a die to a substrate, wherein the substrate has at least one mold barrier between a first region on a first surface of the substrate and a second region on the first surface;
   forming at least one trench in the first surface of the substrate to form the at least one mold barrier;
   disposing a metal trace in the at least one trench;
   attaching one or more components to the substrate in the first region; and
   applying a first encapsulant over the one or more components in the first region, wherein the at least one mold barrier is configured to block a portion of the first encapsulant from moving from the first region of the substrate to the second region of the substrate during the application of the first encapsulant.

2. The method of claim 1, wherein attaching the die to the substrate comprises attaching the die to the first surface in the first region.

3. The method of claim 1, wherein attaching the die to the substrate comprises attaching the die to a second surface of the substrate, the second surface being different from the first surface.

4. The method of claim 3, further comprising:
   applying a second encapsulant over the die and the second surface of the substrate.

5. The method of claim 1, further comprising:
   applying solder resist to the first surface of the substrate to form the at least one mold barrier.

6. The method of claim 1, further comprising:
   testing the packaged assembly comprising the die, the substrate, and the components.

7. A packaged assembly for integrated circuits, comprising:
   a substrate having at least one mold barrier between a first region on a first surface of the substrate and a second region on the first surface;
   a die attached to the substrate;
   one or more components attached to the substrate in the first region;
   a first encapsulant over the one or more components in the first region, wherein the at least one mold barrier is configured to block a portion of the first encapsulant from moving from the first region of the substrate to the second region of the substrate during an application of the first encapsulant and wherein the at least one mold barrier comprises at least one trench formed below the first surface of the substrate; and
   a metal trace disposed in the at least one trench.

8. The packaged assembly of claim 7, wherein the die is attached to the first surface in the first region.

9. The packaged assembly of claim 7, wherein the die is attached to a second surface of the substrate, the second surface being different from the first surface, and wherein the packaged assembly further comprises a second encapsulant over the die and the second surface of the substrate.

10. The packaged assembly of claim 7, wherein the at least one mold barrier further comprises a material protruding above the first surface of the substrate and wherein the material comprises solder resist.

11. The packaged assembly of claim 7, wherein the second region of the substrate is rectangular and wherein the at least one mold barrier comprises four mold barrier segments surrounding the second region, one of the four mold barrier segments on each side of the second region.

12. The packaged assembly of claim 7, wherein the second region of the substrate is rectangular and wherein the at least one mold barrier comprises:
    a first mold barrier segment disposed between the first region and the second region;
    a second mold barrier segment that intersects the first mold barrier segment at a first point of the first mold barrier segment; and
    a third mold barrier segment that intersects the first mold barrier segment at a second point of the first mold barrier segment.

13. The packaged assembly of claim 7, wherein the second region of the substrate is rectangular and wherein the at least one mold barrier comprises:

a first mold barrier segment between the first region and the second region; and a second mold barrier segment parallel to the first mold barrier segment.

14. The packaged assembly of claim 7, wherein the second region of the substrate is rectangular and wherein the at least one mold barrier is a single mold barrier segment between the first region and the second region.

15. The packaged assembly of claim 7, wherein the second region of the substrate is rectangular and bounded on one edge by an edge of the substrate.

16. The packaged assembly of claim 7, wherein:

a border between the first region and the second region comprises a plurality of segments connecting at least three points that are nonlinear; and the at least one mold barrier comprises a plurality of mold barrier segments corresponding to the plurality of mold barrier segments.

17. The packaged assembly of claim 7, wherein the second region is surrounded by the first region.

* * * * *